United States Patent
Lake

(12) United States Patent (10) Patent No.: US 7,425,507 B2
Lake (45) Date of Patent: Sep. 16, 2008

(54) SEMICONDUCTOR SUBSTRATES INCLUDING VIAS OF NONUNIFORM CROSS SECTION, METHODS OF FORMING AND ASSOCIATED STRUCTURES

(75) Inventor: Rickie C. Lake, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 11/168,787

(22) Filed: Jun. 28, 2005

(65) Prior Publication Data

US 2006/0292877 A1    Dec. 28, 2006

(51) Int. Cl.
    *H01L 21/311*    (2006.01)
(52) U.S. Cl. ................................. 438/694; 438/638
(58) Field of Classification Search ............ 438/694, 438/710, 696, 719, 637–640, 672, 675, 969
    See application file for complete search history.

(56) References Cited

U.S. PATENT DOCUMENTS

| | | | |
|---|---|---|---|
| 4,855,017 A | | 8/1989 | Douglas |
| 5,438,212 A | * | 8/1995 | Okaniwa .................... 257/275 |
| 5,690,841 A | * | 11/1997 | Elderstig ..................... 216/39 |
| 6,051,503 A | | 4/2000 | Bhardwaj et al. |
| 6,596,620 B2 | | 7/2003 | Cheng et al. |
| 6,613,662 B2 | | 9/2003 | Wark et al. |
| 6,759,340 B2 | | 7/2004 | Nallan et al. |
| 6,787,443 B1 | | 9/2004 | Boggs et al. |
| 6,846,746 B2 | | 1/2005 | Rattner et al. |
| 7,202,148 B2 | * | 4/2007 | Chen et al. ................... 438/585 |
| 2003/0064546 A1 | | 4/2003 | McCormick et al. |
| 2004/0023508 A1 | | 2/2004 | Chinn et al. |
| 2004/0198040 A1 | | 10/2004 | Geefay et al. |

OTHER PUBLICATIONS

Lai et al., Unaxis' New Deep Silicon Etch Technology (DSE™ -III), Compound Semiconductors (2 pages).
Singer et al., The Effect of Via-in-Pad Via-Fill on Solder Joint Void Formation, Cookson Electronics (12 pages).
Rawal et al., Study of REactive Ion Etching Process to Fabricate Reliable Via-Hole Ground Connections in GaAs MMICs, Solid State Physics Laboratory, India (4 pages).

* cited by examiner

*Primary Examiner*—Kevin M Picardat
(74) *Attorney, Agent, or Firm*—TraskBritt

(57) ABSTRACT

Methods for forming a via and a conductive path are disclosed. The methods include forming a via within a wafer with cyclic etch/polymer phases, followed by an augmented etch phase. The resulting via may include a first portion having a substantially uniform cross section and a second portion in the form of a hollow ball, extending laterally further within the wafer than the first portion. Back-grinding the wafer to the second portion of the via may create a vent. A conductive path may be formed by filling the via with a conductive material, such as solder. Flux gases may escape through the vent. The wafer surrounding the second portion of the via may be removed, exposing a conductive element in the shape of a ball, the shape of the second portion of the via. Semiconductor devices including the conductive paths of the present invention are also disclosed.

35 Claims, 6 Drawing Sheets

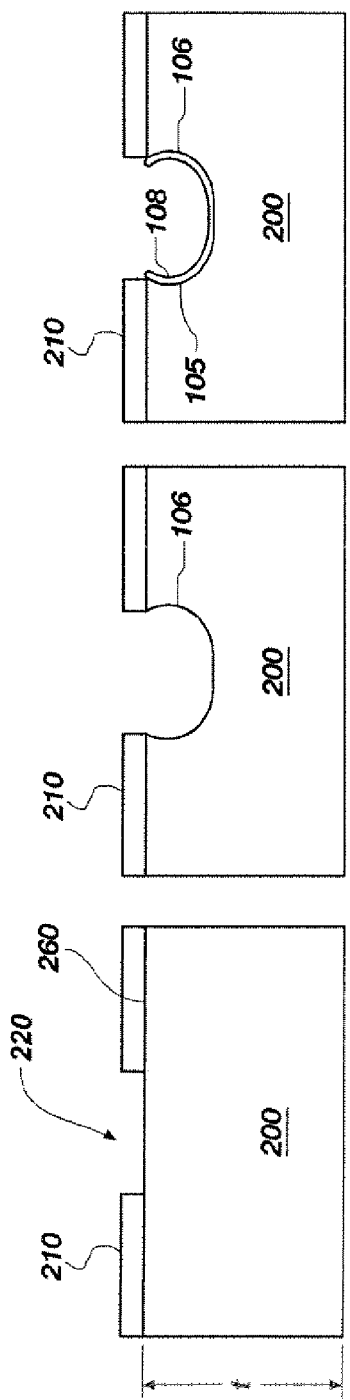
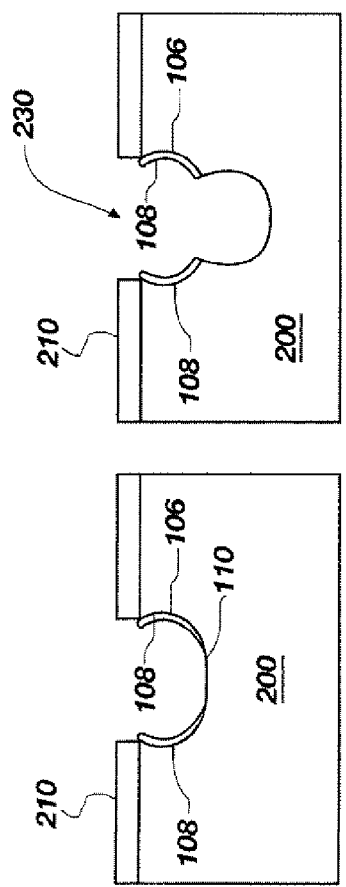

SEMICONDUCTOR SUBSTRATES INCLUDING VIAS OF NONUNIFORM CROSS SECTION, METHODS OF FORMING AND ASSOCIATED STRUCTURES

BACKGROUND OF THE INVENTION

1. Field of the Invention

The present invention relates generally to the field of semiconductor device fabrication and, more particularly, to wafers having vias formed therein. Methods of forming vias, including vented vias and vias filled with conductive material and having conductive elements thereon are also included.

2. Background of Related Art

Semiconductor chips may be produced with integrated circuits on one or (less commonly) both sides of the chip and may be designed to connect to or interact with other electronic components or other semiconductor chips. Interposers may be utilized for interfacing two electrical components, such as a semiconductor device and a printed circuit board, and contactor boards may be used to interface a semiconductor wafer and a probe card for testing the dice on the semiconductor wafer. Semiconductor chips may be formed of semiconductor wafer or other bulk semiconductor substrate material, while interposers and contactor boards may be formed of silicon, ceramic or polymeric materials.

Through-holes, or vias, which have been conductively lined or filled are typically used for connecting an integrated circuit on one side of a chip to conductive traces on the other side of the chip, a ground or other bias voltage, another electronic component or an integrated circuit on another chip. Vias are also used for providing electrical communication between structures disposed on opposing sides of an interposer or contactor board, wherein the structures may align with contact pads or other structures of electrical components and establish electrical connection between the various components.

Vias may be filled with conductive material in the form of solder. The via sidewalls may be coated with flux, such as hydrochloric acid or borax, to prevent oxides from separating the solder from the sidewalls. A solder paste, which may be as much as 50% flux, may be used to fill the vias, then heated to reflow the solder paste. During the heating process, one or more pockets of flux gases may form within the solder. Such pockets may cause the solder to expand outside the via. Solder expanding outside the via may touch an adjacent via or other conductive element and, thus, create a short circuit. When the pocket of flux gas is unable to escape, a void is created. If large enough, these voids can compromise reliability in the systems they inhabit by impairing an electrical connection or providing a connection which may fail later during use. A hole may be laser-drilled to the bottom of a blind via to provide a vent for the flux gases; however, this requires an additional processing step and additional equipment.

Conventionally, preformed solder balls may be positioned over the end of each via, and heated to reflow and attach the solder balls to the conductive material of the via. The contact between the conductive material of a via and a solder ball may create a brittle solder joint line susceptible to failure. Solder bumps may be formed or placed on the via in many ways, including evaporation, electroplating, printing, stenciling, jetting, stud bumping, and direct placement.

Accordingly, a need exists for a method of forming vias having a vent to release solder flux gases. Being able to form solder balls on vias without a brittle solder joint line therebetween would also be useful.

BRIEF SUMMARY OF THE INVENTION

The present invention, in a number of exemplary embodiments, includes methods for forming through-hole vias, which are also sometimes known as "through-wafer interconnects," or "TWIs," in semiconductor wafers, other bulk semiconductor substrates, and other semiconductor component structures. The through-hole vias may be vented, enabling gases to escape from the vias, particularly while being filled with conductive material. Semiconductor component structures that include the vias and associated structures are also within the scope of the present invention.

In a first exemplary method of forming a via in a semiconductor wafer according to the present invention, a wafer having a first surface and an opposing, second surface is provided. A first via portion having a first diameter is etched into the wafer transverse to a plane thereof to a distal, blind end by performing at least one cycle of alternately performing a first etch phase and a polymer deposition phase from the first surface. A second via portion having a second diameter greater than the first diameter of the first via portion may be etched by performing an augmented etch phase from the first surface to extend the via deeper into the wafer from the blind end of the first via portion, the first via portion and the second via portion together forming a blind via in the wafer. A vented via may be formed by removing a sacrificial portion of the wafer from the second, opposing surface to a distal tip of the blind via to provide an intermediate surface of the wafer and create a vent at the distal tip of the blind via. The resulting vented via may be filled with conductive material, and the wafer may be etched from the intermediate surface to expose the conductive material within the second via portion of the vented via and to reach the level of a finishing surface of the wafer, the finishing surface of the wafer opposing the first surface of the wafer. The via within the wafer, filled with conductive material, forms a conductive path within the wafer. The conductive material formerly within the second via portion comprises a conductive element, integral with, and disposed upon, the conductive path. A polymer collar may be formed on the finishing surface, surrounding the exposed conductive material adjacent the conductive path.

In another exemplary method of forming a via in a wafer according to the present invention, a wafer having a first surface and an opposing, second surface is provided. A first via portion having a first diameter is etched into the wafer and transverse to a plane thereof by performing at least one cycle of alternately performing a first etch phase and a polymer deposition phase from the first surface. A second via portion having a second diameter greater than the first diameter of the first via portion may be etched by performing an augmented etch phase from the first surface to extend the via deeper into the wafer from the distal, blind end of the first via portion. A third via portion having a third diameter greater than the first diameter of the first via portion may be etched by performing another augmented etch phase from the first surface from the distal, blind end of the second via portion, the first via portion, the second via portion, and the third via portion together forming a blind via in the wafer. A sacrificial portion of the wafer may be removed from the second, opposing surface to a distal tip of the blind via to provide an intermediate surface of the wafer and create a vent at the distal tip of the blind via, forming a vented via. The vented via may be filled with a conductive material. A portion of the wafer and the conductive material within the second via portion and the third via portion of the wafer may be removed to provide a finishing surface of the wafer, the finishing surface of the wafer lying in a plane parallel to the first surface of the wafer and ending at the juncture between the first via portion and the second via portion.

In accordance with another aspect of the present invention, a semiconductor component includes a wafer having a first surface and a second surface opposing the first surface. The wafer includes at least one via therein, the via having a first via portion with a substantially uniform cross section extending from the first surface, and a second via portion in the form of a hollow ball positioned adjacent the first via portion. The first via portion may have sidewalls characterized by a series of adjacent concave scallops, while the second via portion may have sidewalls characterized by a single concave scallop, defining the hollow ball.

Other and further features and advantages of the present invention will be apparent from the following descriptions of the various embodiments when read in conjunction with the accompanying drawings. It will be understood by one of ordinary skill in the art that the following embodiments are provided for illustrative and exemplary purposes only, and that numerous combinations of the elements of the various embodiments of the present invention are possible.

BRIEF DESCRIPTION OF THE DRAWINGS

FIGS. 1A-1E illustrate a method of forming a via in a wafer;

DETAILED DESCRIPTION OF THE INVENTION

Figure 2A:
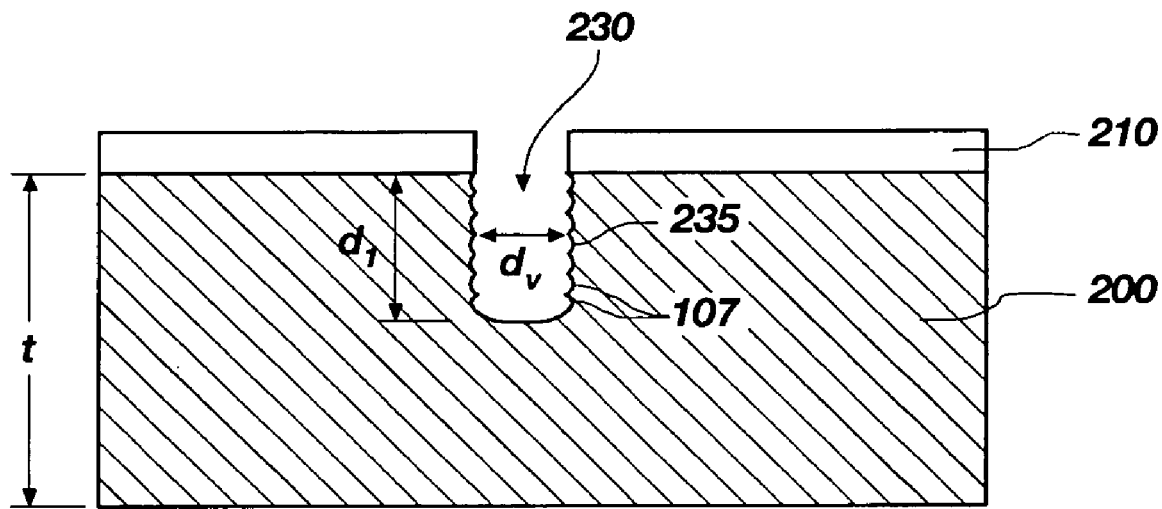
FIGS. 2A-2E depict an exemplary method of forming a vented via in a wafer.

Referring in general to the accompanying drawings, various aspects of the present invention are illustrated to show exemplary wafers including through-hole vias, vias with conductive material disposed therein and conductive elements positioned thereon, as well as methods of forming vias. Common elements of the illustrated embodiments are designated with like reference numerals for clarity. It should be understood that the figures presented are not meant to be illustrative of actual views of any particular portion of a particular wafer, but are merely idealized schematic representations which are employed to more clearly and fully depict the invention. It will be apparent by those of ordinary skill in the art that while the methods and structures disclosed herein describe methods for fabricating vias, the acts and structures described herein comprise a portion of an entire fabrication process of a semiconductor device or other substrate and may be used in combination with other semiconductor fabrication methods.

The term "wafer" used in the following description refers to any generally planar supporting structure including, but not limited to, semiconductor wafers, other bulk semiconductor substrates or other semiconductor component structures. The term should be understood to include silicon, silicon-on-insulator (SOI), silicon-on-sapphire (SOS), doped and undoped semiconductors, epitaxial layers of silicon supported by a base semiconductor foundation, and other semiconductor structures. A wafer may comprise primarily silicon, as formed in the art by growing a single crystal in the form of a cylinder, which is then segmented or sliced transversely to form a plurality of wafers. However, the wafer need not be silicon-based or even a semiconductor. The wafer may be silicon-germanium, germanium, gallium arsenide, indium phosphide, or a suitable ceramic or glass. When reference is made to a "wafer" in the following description, previous process steps may have been utilized to form active regions or junctions in or on the wafer.

A via may be formed in, for example, a silicon wafer using a deep silicon etch process as described hereinbelow, such as deep reactive ion etching (DRIE). One example of DRIE is the "Bosch" process, described in U.S. Pat. No. 4,855,017 to Douglas, entitled "Trench Etch Process for a Single-Wafer RIE Dry Etch Reactor" the disclosure of which is incorporated by reference herein. FIGS. 1A-1E depict one embodiment of a DRIE method of forming a via portion 230 in a wafer 200, alternating cycles of an etch phase and a deposition phase. FIG. 1A depicts the wafer 200. The wafer 200 may have a thickness t sufficient for durability during handling and transport of the wafer 200. A minimum handleable thickness for a wafer 200 is typically about 300 µm. A mask 210 may be disposed on a first surface 260 of the wafer 200 and may be patterned with at least one aperture 220 therethrough to define a desired location for the formation of a via within the wafer 200. The mask 210 may comprise either an organic-based photoresist, a silicon-based imageable masking material, or a hard mask material, such as, by way of example and not by way of limitation, silicon oxide, silicon nitride, or silicon oxynitride. Deposition and patterning of the masking layer may be performed using techniques known in the art, depending on the particular masking material used.

FIG. 1B shows the wafer 200 after performance of a DRIE etch phase for initial via 106 formation. The wafer 200 may be etched by exposing the wafer 200 to a plasma generated from a fluorine-containing gas. The fluorine-containing gas may comprise at least 70 volume % of the plasma source gas used during etching. The fluorine-containing gas may be selected from the group consisting of $SF_6$, $CF_4$, $NF_3$, and combinations thereof. Sulfur hexafluoride ($SF_6$) is typically used in the art. The plasma source gas may optionally include a nonreactive, diluent gas, such as, for example and not by way of limitation, argon, helium, xenon, krypton, and combinations thereof.

The etch phase may be followed by a DRIE deposition phase. FIG. 1C depicts a coating 108 of polymer deposited on the bottom and sidewalls of the initial via 106. The coating 108 of polymer or other suitable material may help prevent lateral etching of the via sidewall 105 during a vertical etch portion of a subsequent cycle. To form the coating 108, the wafer 200 may be exposed to a plasma generated from a gas which is capable of forming a polymer, for example, on etched silicon surfaces. The polymer-forming gas may be a carbon-containing gas, such as $C_4F_8$, $CH_2F_2$, $CHF_3$, or $CF_4$. $C_4F_8$ is typically used in the art. The polymer-forming gas may also be HBr or other compounds capable of reacting with silicon to form a polymer. Hydrogen from the HBr may react with carbon from a photoresist masking layer to form an organic polymer. Alternatively, if a silicon oxide mask 210 is used, bromine from the HBr may react with oxygen from the oxide mask 210 and silicon from the substrate being etched to form silicon oxybromide, a nonvolatile etch byproduct which deposits on etched silicon surfaces.

The DRIE etch and polymer deposition phases may be repeated for a number of cycles. FIG. 1D shows the wafer 200 after the start of a second etch phase. The bottom 110 of the initial via 106 has been cleared of polymer. FIG. 1E shows the wafer 200 after the completion of the second etch phase. The process conditions used during the second (or third, or fourth, etc.) etch phase may be the same or different from those used in the first etch phase, but typically will be similar to provide a first via portion 230 (FIG. 2A) having a substantially uniform cross-sectional diameter as the first via portion 230 extends into the wafer 200. The plasma source power, for example, may be varied from etch phase to etch phase, or the substrate bias voltage may be varied, so that the etch profile can be closely controlled and defined. While the via portion 230 may have a substantially uniform cross-sectional diameter, the cycling of gases in the etch/deposition process introduces a unique type of sidewall roughness, known as scalloping.

FIG. 2A depicts the wafer 200 after several cycles of the DRIE etch/deposition process with the first via portion 230 having sidewalls 235 with scallops 107. Scalloping occurs because the selected etch may be relatively isotropic. Because of the discontinuous etch and deposition steps in a DRIE etch/polymer deposition process, the cross-sectional etch profile of a single etch cycle when forming a via may not exhibit a linear sidewall portion, but rather a concave sidewall portion. Every etch/deposition cycle may, thus, leave a concave scallop 107 forming a portion of the first via sidewall 235. This shape is then repeated for each successive etch phase, resulting in a sidewall 235 with a wavy, scalloped cross-sectional profile.

The first via portion 230 depicted in FIG. 2A is a blind via, i.e., a via which does not extend entirely through the wafer 200. The first via portion 230 may be formed in the wafer 200 by multiple cycles of the DRIE cyclic etch/deposition method described hereinabove. The first via portion 230 may be formed to the desired depth, for example, to a depth $d_1$ of about 150 μm into the wafer 200 having a thickness t of, for example, about 300 μm or greater. The first via portion 230 may have a diameter $d_v$ of, for example, about 50 μm.

Figure 2B:
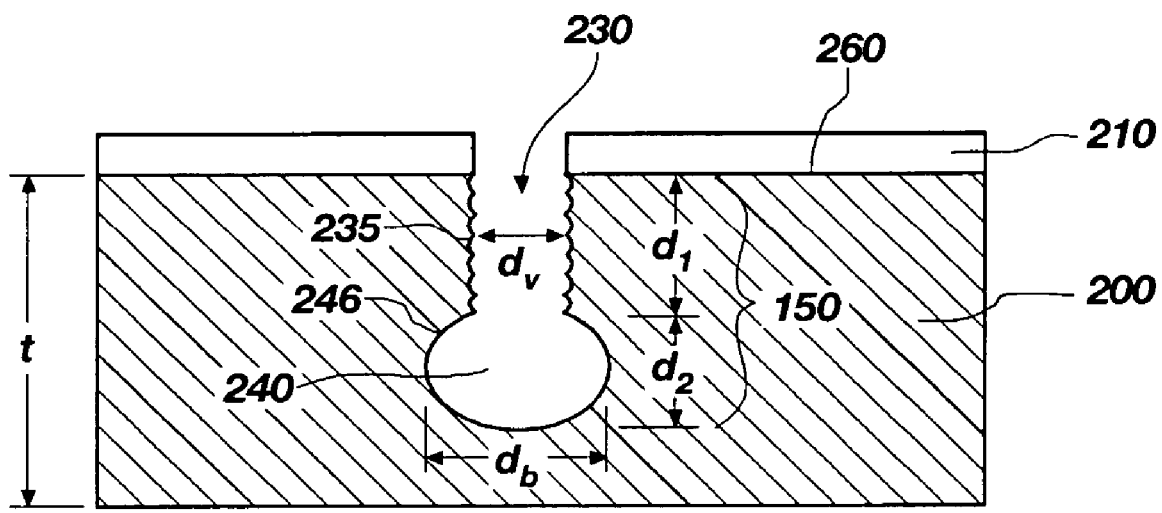

FIG. 2B illustrates the wafer 200, wherein an augmented etch phase using the same type of etch (DRIE) may be used to form a second via portion, a substantially spherical cavity 240, which may also be characterized as a hollow ball, at the base of the first via portion 230, distal from the first surface 260 of the wafer 200. The substantially spherical cavity 240 may extend further laterally within the wafer 200 than the first via portion 230. During the augmented etch phase, the wafer 200 may, for example, be exposed to the etchant for an extended period of time or under an increased pressure to increase the etch rate. The polymer deposition phase may be postponed until the substantially spherical cavity 240 has reached the desired dimensions; alternatively, there may be no final polymer deposition phase employed. The substantially spherical cavity 240 may have a diameter $d_b$ greater than the diameter $d_v$ of the first via portion 230. The augmented etch cycle enables an inclusive via 150, including both the first via portion 230 and the substantially spherical cavity 240, to be formed in a shorter time span, and with fewer steps than required to form a via of equal depth using the cyclic plasma etch/polymer deposition phases used to form the first via portion 230. That is, the depth $d_1$ of the first via portion 230 plus the depth $d_2$ of the substantially spherical cavity 240 are formed in a shorter time span, and with fewer steps than would be required to increase the depth $d_1$ of the first via portion 230 by a depth $d_2$ using continued cyclic plasma etch/polymer deposition phases.

The depth $d_2$ of the substantially spherical cavity 240 may be, for example, between half again the depth $d_1$ of the first via portion 230 and similar to the depth $d_1$ of the first via portion 230. By way of example, and not limitation, the depth $d_2$ of the substantially spherical cavity 240 and, also, the diameter $d_b$ thereof may be between about 80 μm and 125 μm. It will be understood by one skilled in the art that the substantially spherical cavity 240 may be spherical in shape, or may be somewhat oblong on shape. Thus the depth $d_2$ of the substantially spherical cavity 240 may be greater or less than the substantially spherical cavity diameter $d_b$. The sidewalls 246 of the substantially spherical cavity 240 are concave, however, because the substantially spherical cavity 240 is formed in a single, augmented etch phase, the substantially spherical cavity sidewalls 246 do not have the scalloped profile of the sidewalls 235 of the first via portion 230.

Figure 2C:
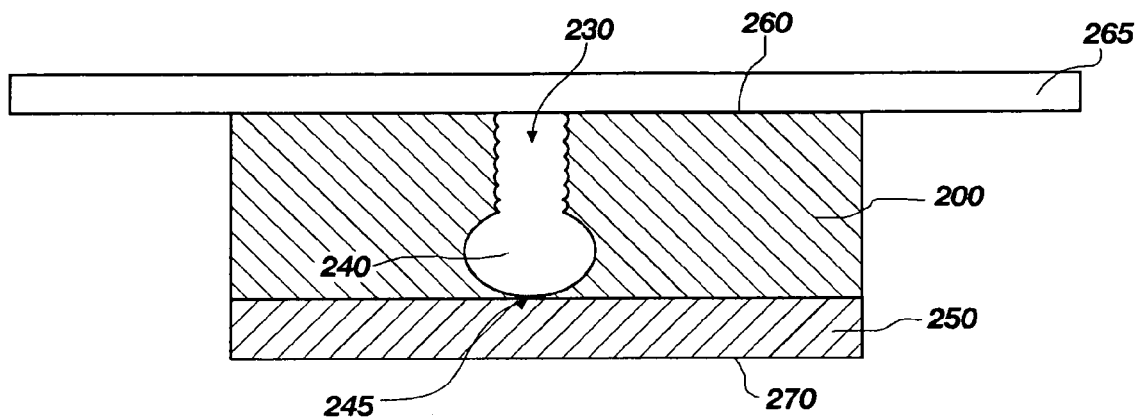

The first via portion 230 is formed from the first surface 260 of the wafer 200 as described hereinabove. The first surface 260 is illustrated covered with the mask 210 in FIG. 2B. After formation of the first via portion 230 and the substantially spherical cavity 240, the mask 210 may optionally be removed, for example, using a chemical etch or an abrasive, mechanical method. As depicted in FIG. 2C, the first surface 260 of the wafer 200 may be affixed to a wafer tape 265, also known as a dicing tape. The wafer tape 265 may comprise a PVC sheet or film with an adhesive on one side to hold the wafer 200. One exemplary type of wafer tape 265 is UV-tape, an adhesive tape which has sufficient adhesive strength to secure the wafer 200 during dicing or grinding, yet the adhesive strength may diminish after being irradiated with UV irradiation. After the UV irradiation, the wafer tape 265 may be easily peeled off from the wafer 200 in a picking-up or delamination process.

Figure 2D:
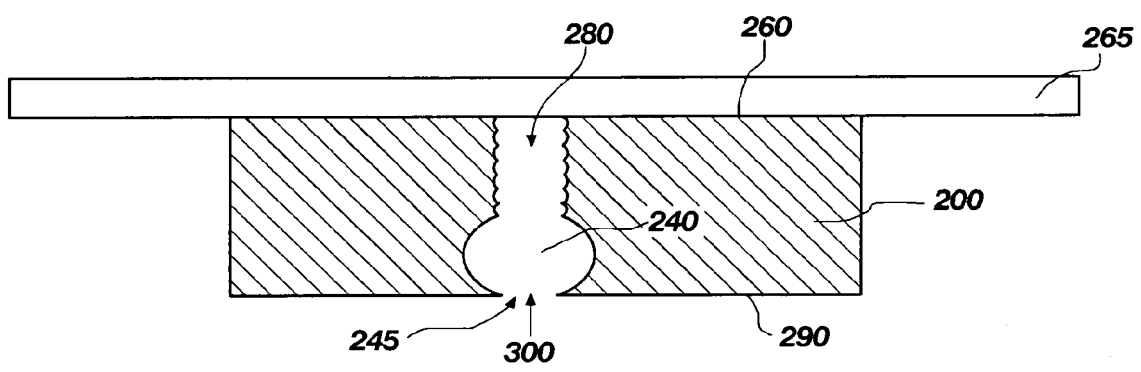

FIG. 2C depicts a sacrificial portion 250 of the wafer 200, the portion of the wafer 200 through which the first via portion 230 and substantially spherical cavity 240 do not extend, and including a second surface 270. The second surface 270 opposes the first surface 260, which is adhered to the wafer tape 265. The sacrificial portion 250 of the wafer 200 may be removed, for example by mechanical or chemical methods, such as back-grinding, chemical mechanical planarization (CMP) or a chemical wet etch to open substantially spherical cavity 240 from the second surface 270 and form a vented via 280, as shown in FIG. 2D. The removal of wafer material from the second surface 270 forms an intermediate surface 290 of the wafer 200, a surface within a plane substantially parallel to the first surface 260, and including the tip 245 of the substantially spherical cavity 240, the point farthest from the first via portion 230. The intermediate surface 290 may be breached at the tip 245 of the substantially spherical cavity 240, to form a vent 300. The intermediate surface 290 may be breached by the back-grinding as the wafer 200 enclosing the tip 245 of the substantially spherical cavity 240 is removed. Optionally, the intermediate surface 290 may be breached to form a vent 300 using a laser ablation process after the level of intermediate surface 290 has been reached, yet contact with substantially spherical cavity 240 has not been achieved; however, laser ablation will require an additional process act. It will be further understood by one of ordinary skill in the art that the method presented herein may also be used to form a via and conductive element, as described hereinbelow, without breaching the intermediate surface 290 of the wafer 200 and forming a vent 300.

Figure 2E:
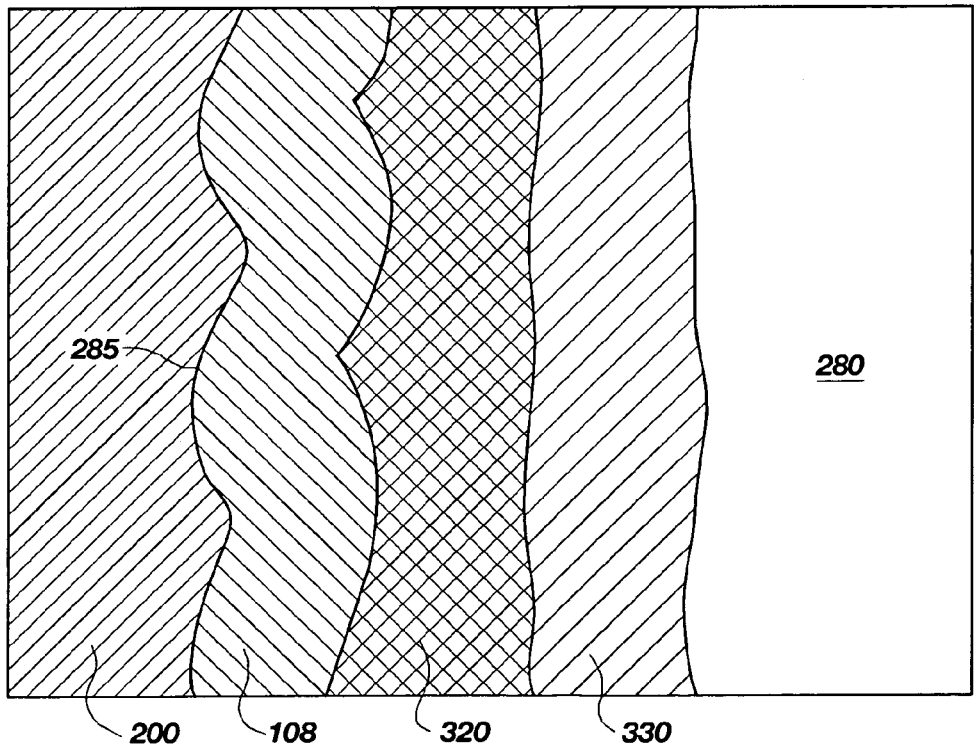

FIG. 2E depicts a close-up view of a portion of the wafer 200 and a sidewall 285 of the vented via 280. The sidewall 285 of the vented via 280 are covered with the coating 108, formed as described hereinabove during the polymer deposition phase of the deep silicon etch process by which the vented via 280 has been formed. The sidewall 285 may further be coated with a further dielectric layer 320 and a conductive layer 330. The further dielectric layer 320, also known as a passivation layer, may comprise any known insulating material such as silicon oxide, silicon nitride or silicon oxynitride deposited to any desired thickness using chemical vapor deposition (CVD), pulsed laser deposition (PLD) or other known deposition process. The dielectric layer 320 may also be grown on exposed walls of the vented via 280 using an oxidizing atmosphere such as steam and oxygen at an elevated temperature. The dielectric layer 320 may also comprise an insulating polymer, such as a polyimide deposited using a suitable process such as a spin-on process or an injection or capillary process, a Parylene™ polymer, or benzocyclobutene (BCB). The dielectric layer 320 may provide an electrically insulative layer of separation between the inner surface of the vented vias 280 and any conductive material forming a conductive path within the vented via 280, as described hereinbelow.

A physical vapor deposition (PVD, or sputtering) process or chemical vapor deposition (CVD) process may be used to form the conductive layer 330. Alternatively, an electroless or an electrolytic plating process may be used to form the conductive layer 330. In such instances, a seed layer may be formed on the sidewall 285 prior to plating, as known in the art. The conductive layer 330 may comprise a material highly wettable by most solders, for example, a metal material such as nickel or copper.

Figure 3A:
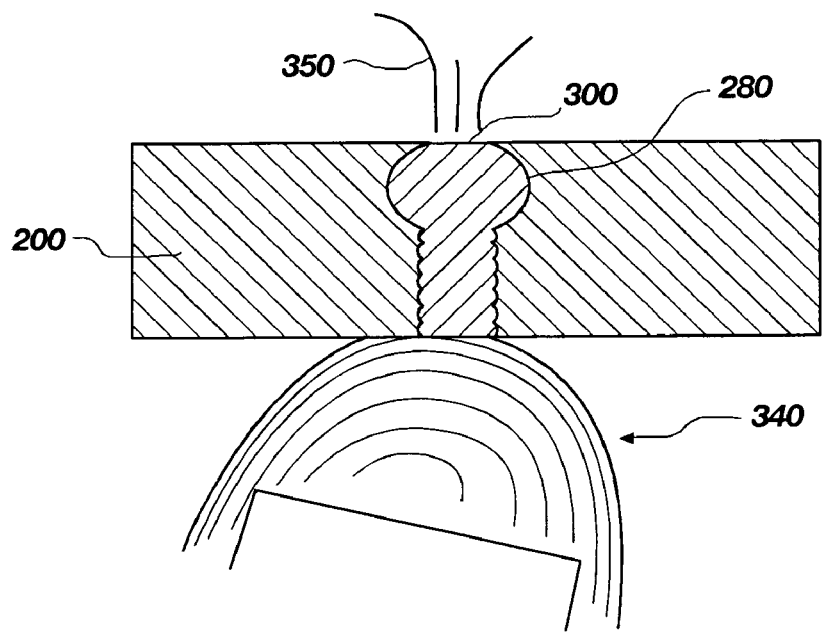
FIGS. 3A-3C illustrate an exemplary method of forming a conductive path through the wafer.

The vented via 280 may be filled with a conductive material, for example, using a wave soldering process, as schematically depicted in FIG. 3A. Prior to filling the vented via 280, solder flux may be applied to the wafer 200 so that during the subsequent solder fill operation, the solder will wet the conductive layer 330 (FIG. 2E) within the vented via 280. The flux may be sprayed into the vented via 280. The wafer 200 may be transported through a wave solder machine wherein the wafer 200 is moved over a wave of solder 340. The wave of solder 340 contacts the first surface 260 of the wafer 200 and is drawn or forced up into the vented via 280. The solder wets to the conductive layer 330 and fills the vented via 280. Flux gases 350 may escape through the vent 300.

Another exemplary method of filling the vented via 280 with a conductive material includes physically placing a solder paste into the via, for example, by squeegeeing. Suitable solder pastes for use with the instant process can comprise any combination of chemical components that produce paste properties resulting in the desired chemical and physical characteristics for application (e.g., bonding characteristics and viscosity), reflow, cleaning, and formation of a final, encapsulated, raised ball-bond semiconductor structure. The solder paste may be a low-melting-point alloy, usually of lead (Pb) and tin (Sn), that wets to copper or nickel, conducts current, and mechanically joins conductors and the like. Other suitable ingredients for use as a solder paste include, without limitation, aluminum, palladium, gold, copper, indium, silver, tin, lead and combinations or alloys thereof. The solder paste may conventionally include a blend of the desired weight percent of alloy powder into a flux to produce a substantially homogeneous product. The wafer 200 may then be heated to reflow the solder, fill the vented via 280, and form a conductive path through vented via 280, any volatilized flux being vented, leaving a void-free conductive path. Alternatively, a solder fill process using application of preformed solder balls to a surface of the wafer followed by heating to reflow the solder and application of a vacuum from the opposing surface of the wafer to draw the molten solder into the via, as known in the art, may be used.

Referring back to FIG. 2B, an inclusive via 150 including the first via portion 230 and the substantially spherical cavity 240 may be filled with a conductive material without breaching the intermediate surface 290 of the wafer 200 and forming a vent 300. The inclusive via 150 is a blind via, and may be filled using a vacuum solder technique. Inside a closable chamber, a flat, shallow pan with a conductive material, for example, molten solder may be provided. The chamber atmosphere is ideally purged of all oxygen using nitrogen or other inert or oxide reducing gas. The wafer 200 with inclusive via 150 may be placed in the chamber with the first surface 260 of the wafer 200 facing down towards the molten solder. A vacuum may be drawn, and the first surface 260 of the wafer 200 is then lowered into molten solder. The wafer 200 can be completely submerged, but this is not necessary so long as the first surface 260 is in contact with the solder. The chamber may then be vented back to atmospheric pressure (plus or minus) to draw or force the molten solder into the inclusive via 150. The wafer 200 may be removed from the molten solder and cooled, leaving the solder within the inclusive via 150. The wafer 200 may be removed from the chamber and back-ground and/or etched to expose a substantially spherical conductive element 360 as described hereinbelow and depicted in FIG. 3C. Alternatively, the wafer 200 may be placed into the solder face up. The wafer 200 may be completely submerged to allow solder to flow over and completely cover the first surface 260 of the wafer 200 prior to venting back to atmospheric pressure to force the solder within the inclusive via 150.

In another method for filling the inclusive via 150, a solder ball may be applied on the first surface 260, at the top of the inclusive via 150 opening. The wafer 200 may be placed into a vacuum heating chamber. The vacuum may be drawn, and heat applied to reflow the solder. When the solder balls become molten, the chamber may be backfilled with nitrogen to approximately atmospheric pressure. Solder will then be forced into the inclusive via 150. The solder may be cooled to solidify. The wafer 200 may then be removed from the chamber and back-ground and/or etched to expose the solder ball as described hereinbelow and depicted in FIG. 3C.

The use of vacuum methods such as described hereinabove may be particularly useful where there is no wettable metal plating such as the conductive layer 330 depicted in FIG. 2E. Plating may be eliminated during use of vacuum methods as the solder is forced into the vias instead of relying upon capillary or wetting forces.

Figure 3B:
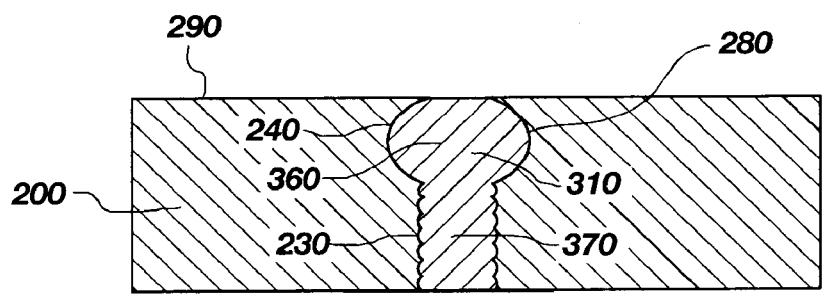
Figure 3C:
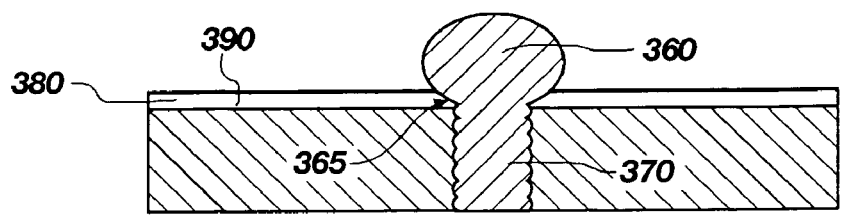

FIG. 3B depicts wafer 200 in an inverted position, the vented via 280 being completely filled with conductive material 310. A substantially spherical conductive element 360, for example, a solder ball, has been formed within the substantially spherical cavity 240 of the vented via 280. A conductive path 370 is formed by the solder residing in the first via portion 230 of the vented via 280, which conductive path is integral with the substantially spherical conductive element 360. The portion of the wafer 200 surrounding the conductive element 360 may be removed from the intermediate surface 290, for example, using a chemical etch. One example of an isotropic wet etch uses a mixture of nitric acid ($HNO_3$) and hydrofluoric acid (HF). The nitric acid consumes the silicon surface to form a layer of silicon dioxide, which in turn is dissolved away by the HF. Alternatively, the portion of the wafer 200 may be removed with CMP using a soft pad and a chemical solution highly selective to silicon, to expose the substantially spherical conductive element 360 as depicted in FIG. 3C. A finishing surface 390 of the wafer 200, extending laterally from the junction point of the substantially spherical conductive element 360 and the conductive path 370 may thus be formed. A layer of dielectric material may then be formed on the finishing surface 390 of the wafer 200, surrounding the base 365 of the conductive element 360 to form a polymer collar 380, which may improve the joint reliability between substantially spherical conductive element 360 and conductive path 370, particularly the fatigue performance thereof during thermal cycling. The conductive element 360 may, optionally, be heated in a reflow process, as known in the art, to reform the conductive element 360 in a more perfect sphere.

The conductive element 360 may be formed within the substantially spherical cavity 240 to be more diminutive in size than a solder ball formed by a conventional method, such as evaporation, electroplating, printing, jetting, stud bumping, and direct placement. For example, when printing or jetting solder to form a solder ball, a minimum quantity of solder must be extruded or jetted, and thus the solder ball formed must be at least as large as this minimum size. In contrast, the conductive element 360 may have a significantly smaller diameter corresponding to the diameter $d_b$ of the substantially spherical cavity 240, which serves as mold cavity to form the substantially spherical conductive element 360. The substantially spherical conductive element 360 may have a diameter smaller than the diameter $d_b$ of the substantially spherical cavity 240 because the interior of the substantially spherical cavity 240 may be covered with the polymer coating 108, the dielectric layer 320, and the conductive layer 330, some or all of which may be removed by etching of wafer 200 to finishing surface 390 (see FIG. 2E). Thus, conductive elements 360 having a diameter of as little as 60 μm may be formed once, for example, dielectric layer 320 and conductive layer 330 have been removed from the outer surface of conductive material 310. Optionally, the conductive element 360 may include the conductive layer 330, if this layer is not removed with the portion of the wafer 200 surrounding the conductive element 360. In yet another approach, only the sidewalls of the first via portion 230 may remain covered with the conductive layer 330, and not the substantially spherical cavity 240. In such an instance, the wafer 200, polymer coating 108, and the dielectric layer 320 may be etched back, and the resulting conductive element 360 may be formed entirely of the conductive material 310 used to fill the vented via 280. For example, the conductive element 360 may be a solder ball. The conductive element 360 of the present invention is integrally formed with the conductive path 370 and, therefore, may have a high ball-shear strength, a measure of the reliability of a solder joint between a solder ball and conductive material, for example, conductive material within a via. The conductive material 310 of the conductive element 360 is provided simultaneously with the conductive material 310 filling the vented via 280 and, therefore, fewer processing acts are required, compared with a typical method of forming or applying conductive elements in a separate act after the formation and filling of through-hole vias.

Figure 4A:
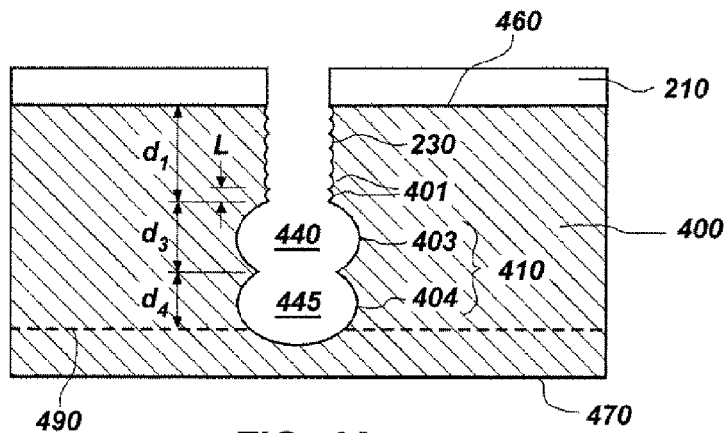
FIGS. 4A-4D illustrate another exemplary method of forming a vented via and a conductive path in a wafer.

In a second exemplary method of forming a vented via, a first via portion 230, as depicted in FIG. 2A, is formed within a wafer 400 to, for example, a depth $_{d1}$ of about 150 μm, as described hereinabove. A mask 210 may be disposed over a first surface 460 of the wafer 400, as described with respect to the first embodiment of the present invention. The formation of the first via portion 230 using DRIE is followed by a first augmented etch phase, a polymer deposition phase, and a second augmented etch phase to form the structure depicted in FIG. 4A. Each augmented etch phase forms a substantially spherical cavity 440, 445, the cavities together comprising an extended via portion 410 having an increased maximum diameter in comparison to the diameter of the first via portion 230. The extended via portion 410 may be positioned deeper within the wafer 400, farther from the first surface 460, than the first via portion 230. Each substantially spherical cavity 440, 445 may extend laterally within the wafer 400 farther than the first via portion 230. In other words, the diameter of each substantially spherical cavity 440, 445, may be greater than the diameter of the first via portion 230. The first via portion 230 may extend within the wafer 400 to a depth $d_1$ of about 150 μm. Each substantially spherical cavity 440, 445 may extend to a depth of, for example, about 75 μm. Two scallops 403, 404, each having a greater length $d_3$, $d_4$ in comparison to the length L of the individual scallops 401 of the first via portion 230 form a sidewall of the extended via portion 410. For example, the length L of the individual scallops 401 of the first via portion 230 may be about 1 μm, compared to the length $d_3$, $d_4$ of the scallops 403, 404 of the substantially spherical cavities 440, 445, which may each be about 75 μm.

Figure 4B:
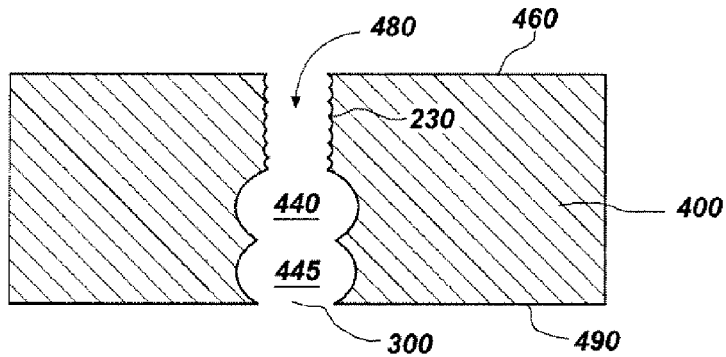
Figure 4C:
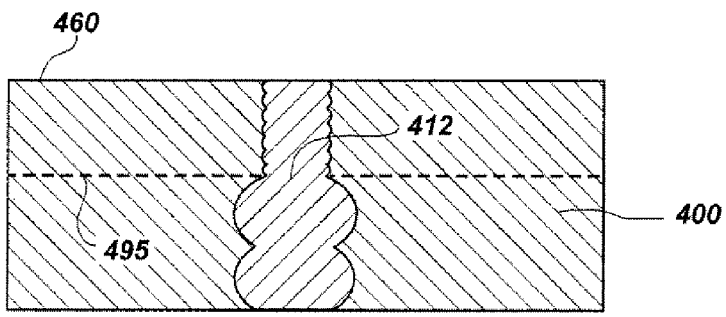

A sacrificial portion of the wafer 400, the portion of the wafer 400 from a second side 470 of the wafer 400 to the level of an intermediate surface 490 at the tip of the substantially spherical cavity 445, may be removed, as by the previously described chemical or mechanical methods, to form the structure depicted in FIG. 4B. A vented via 480 within the wafer 400 includes a first via portion 230 having a substantially uniform cross-sectional diameter in communication with substantially spherical cavity 445 distal from the first via portion 230 which includes a vent 300 comprising an aperture through the exposed intermediate surface 490 of the wafer 400. Using more than one augmented etch phase to form the vented via 480 enables a via of a desired length to be formed more deeply into a wafer 400 using only a few additional etch cycles, and faster than forming a via to the desired length using etch/deposition cycles of consistent intensity. Furthermore, using a deeper etch than in the first embodiment by performing an additional augmented etch cycle requires the wafer 400 to be back-ground to open the blind end of the via only to a thickness of, for example, about 300 μm rather than about 230 to 275 μm, leaving a much more robust wafer structure for filling the vented via 480 with solder.

Figure 4D:
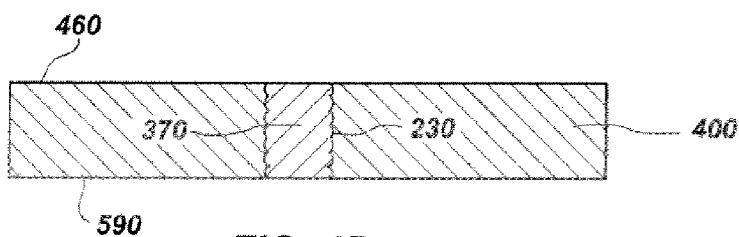

The sidewall of vented via 480 may be coated with a dielectric layer, and plated with a conductive layer, then filled with a conductive material 412, for example using a solder wave machine, a vacuum/reflow method, or placing a solder paste within the vented via 480, followed by reflow, in the manner previously described with respect to the first embodiment. A portion of the wafer 400 may be removed, from the intermediate surface 490 to a plane 495 within the wafer 400 including the junction between the first via portion 230 and the substantially spherical cavity 440. The removal may take place using chemical or mechanical methods, for example, wet etching or chemical mechanical planarization. In addition to the portion of the wafer 400 surrounding the substantially spherical cavities 440, 445, the conductive material 412 within the substantially spherical cavities 440, 445 may itself be removed, in which instance back-grinding the wafer 400 may be the most expeditious approach. FIG. 4D depicts a wafer 400 having a conductive path 370 formed therein, from the first surface 460 of the wafer 400 to a finishing surface 590 corresponding to the plane 495. It should be noted that, if conductive material 412 within substantially spherical cavities 440, 445 is not removed by back-grinding, such conductive material 412 may be reflowed to produce a larger diameter solder ball than in the case of the first embodiment, if desired.

Figure 5:
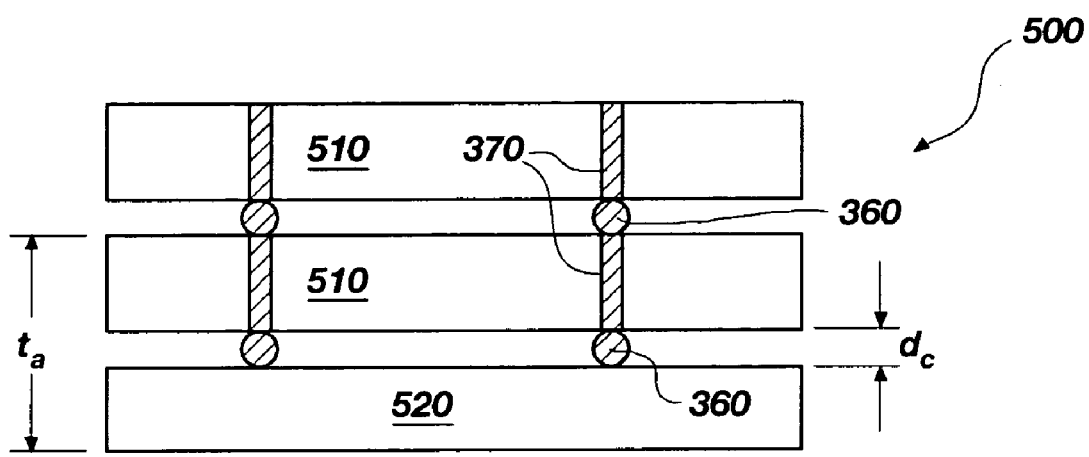
FIG. 5 illustrates a stacked semiconductor device assembly including vias and conductive elements of the present invention.

FIG. 5 depicts a stacked assembly 500 of semiconductor components in the form of a plurality of semiconductor devices 510, mounted to a substrate 520. Conductive paths 370 with integrally formed conductive elements 360 connect the semiconductor devices 510 and the substrate 520. The substrate 520 may include a pattern of conductive traces thereon, with which the conductive elements 360 may be in electrical communication. The conductive elements 360 may have a diameter $d_c$ of, for example, between about 60 μm and about 100 μm. The separation or standoff of the lowermost semiconductor device 510 and the substrate 520 may, therefore, be between about 60 μm and 100 μm. The total thickness $t_a$ of the stacked assembly 500 may be smaller than a stacked assembly including conventionally formed solder balls, which may have a greater diameter than the conductive elements 360 of the present invention. Further, the diminutive size of the conductive elements 360 enables the conductive elements to be packed to a higher density (smaller lateral spacing, or pitch), without danger of shorting, than typical solder balls of a greater dimension.

Figure 6:
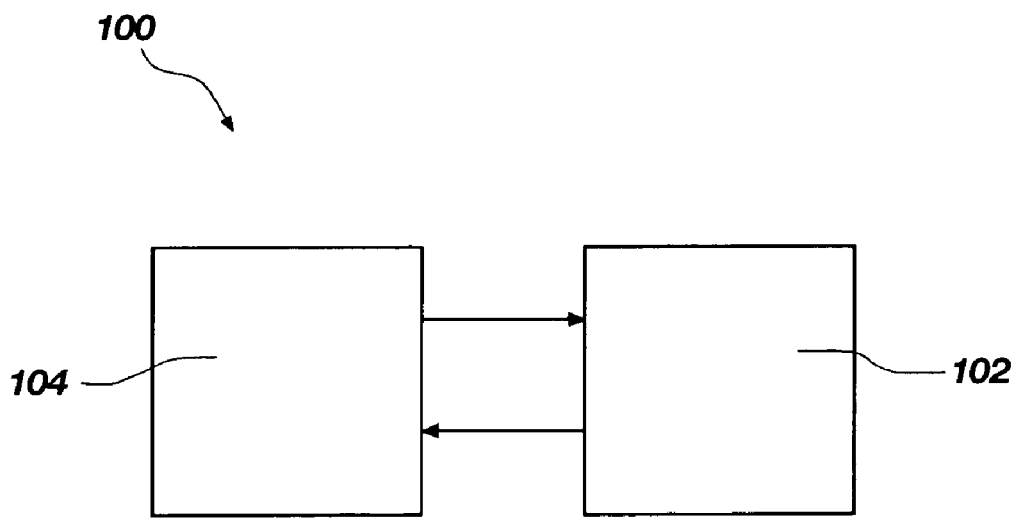
FIG. 6 is a schematic diagram of an electronic system having at least one component incorporating vias and conductive elements of the present invention.

FIG. 6 schematically illustrates an electronic system 100 including the conductive vias of the present invention. The electronic system 100 includes a memory component 102, such as a static random access memory (SRAM), dynamic random access memory (DRAM), or other known memory component, wherein the memory component 102 comprises a semiconductor component having vias fabricated using methods of the present invention. The memory component 102 is operably connected to a microprocessor 104 that may be programmed to carry out particular functions as known in the art.

Although the foregoing description contains many specifics, these should not be construed as limiting the scope of the present invention, but merely as providing illustrations of some exemplary embodiments. Similarly, other embodiments of the invention may be devised that do not depart from the spirit or scope of the present invention. Features from different embodiments may be employed in combination. For example, a vented via may be formed using a series of more than two augmented etch phases. The scope of the invention is, therefore, indicated and limited only by the appended claims and their legal equivalents, rather than by the foregoing description. All additions, deletions, and modifications to the invention, as disclosed herein, which fall within the meaning and scope of the claims, are to be embraced thereby.

What is claimed is:

1. A method of forming at least one via in a wafer, comprising:
   providing a wafer having a first surface and an opposing, second surface;
   etching a first via portion having a first diameter within the wafer by performing at least one cycle of alternately performing a first etch phase and a polymer deposition phase from the first surface; and
   etching a second via portion to form a substantially spherical cavity within the wafer, the substantially spherical cavity having a second diameter greater than the first diameter of the first via portion by performing an augmented etch phase, the first via portion and the second via portion together forming a blind via in the wafer.

2. The method of claim 1, wherein performing the first etch phase comprises exposing the wafer, through a patterned masking layer defining a location of the at least one via, to a plasma generated from a fluorine-containing gas.

3. The method of claim 2, further comprising selecting the fluorine-containing gas to be at least one of $SF_6$, $CF_4$, $NF_3$.

4. The method of claim 2, further comprising selecting the patterned masking layer to comprise a photoresist.

5. The method of claim 2, further comprising selecting the patterned masking layer to comprise one of silicon oxide, silicon nitride, and silicon oxynitride.

6. The method of claim 1, wherein performing the polymer deposition phase comprises exposing the wafer to a plasma generated from a gas which is capable of forming a polymer on an exposed surface of a material of the wafer.

7. The method of claim 6, wherein the gas is selected to be a gas which reacts with silicon to form a polymer.

8. The method of claim 2, wherein performing the augmented etch phase comprises exposing the wafer, through the patterned masking layer, to a plasma generated from a fluorine-containing gas for a longer time period than a time period of a cycle of the first etch phase.

9. The method of claim 2, wherein performing the augmented etch phase comprises exposing the wafer, through the patterned masking layer, to a plasma generated from a fluorine-containing gas at a higher pressure than a pressure of the fluorine-containing gas of the first etch phase.

10. The method of claim 1, wherein providing the wafer comprises providing a wafer including one of silicon, silicon-on-insulator (SOI), silicon-on-sapphire (SOS), doped silicon, an epitaxial layer of silicon supported by a base semiconductor foundation, another undoped semiconductor material other than silicon, and another doped semiconductor material other than silicon.

11. The method of claim 1, wherein providing the wafer comprises providing a wafer having a thickness of at least about 300 μm.

12. The method of claim 11, wherein etching the first via portion comprises etching the first via portion to a depth of at least 150 μm using a plurality of cycles of alternately performing the first etch phase and the polymer deposition phase.

13. The method of claim 11, wherein etching the second via portion comprises etching the second via portion to a depth of at least 80 μm and a diameter of at least 80 μm.

14. The method of claim 1, wherein etching the second via portion comprises etching the second via portion in the form of a substantially spherical cavity within the wafer.

15. The method of claim 1, further comprising removing a sacrificial portion of the wafer from the opposing, second surface to a distal tip of the blind via to a level of an intermediate surface of the wafer to at least partially expose the substantially spherical cavity within the wafer and create an opening at the distal tip of the blind via to form a vented via.

16. The method of claim 15, wherein removing the sacrificial portion comprises back-grinding.

17. The method of claim 15, wherein removing the sacrificial portion comprises at least one of etching and chemical mechanical planarization.

18. The method of claim 15, further comprising depositing a passivation layer over sidewalls of the vented via.

19. The method of claim 18, further comprising depositing a solder-wettable conductive layer over the passivation layer.

20. The method of claim 15, further comprising filling the vented via with a conductive material.

21. The method of claim 20, wherein filling the vented via with a conductive material comprises filling the vented via with a solder.

22. The method of claim 21, further comprising venting flux gases from the opening at the distal tip of the blind via.

23. The method of claim 21, wherein filling the vented via with the solder is effected by one of a wave soldering process, physically placing a solder paste within the vented via, and reflowing preformed solder balls placed over the vented via.

24. The method of claim 20, further comprising etching the wafer from the intermediate surface to expose the conductive material within the second via portion of the vented via to a level of a finishing surface of the wafer opposing the first surface of the wafer.

25. The method of claim 24, further comprising removing a solder-wettable conductive layer from the exposed conductive material.

26. The method of claim 24, further comprising forming a polymer collar on the finishing surface of the wafer, surrounding the exposed conductive material adjacent a juncture between the conductive material within the first via portion and the second via portion.

27. The method of claim 1, further comprising performing another augmented etch phase from the first surface to form a third via portion on an opposing side of the second via portion from the first via portion, the third portion comprising another substantially spherical cavity having a third diameter greater than the first diameter of the first via portion, the first via portion, the second via portion, and the third via portion together forming a blind via in the wafer.

28. The method of claim 27, further comprising removing a sacrificial portion of the wafer from the opposing, second surface to a distal tip of the blind via to a level of an intermediate surface of the wafer and create a vent at the distal tip of the blind via, forming a vented via.

29. The method of claim 28, further comprising removing a portion of the wafer and a conductive material within the second via portion and the third via portion of the wafer to a level of a finishing surface of the wafer, the finishing surface of the wafer in a plane parallel to the first surface of the wafer and at a juncture between the first via portion and the second via portion.

30. The method of claim 28, further comprising removing a portion of the wafer to a level of a finishing surface of the wafer, the finishing surface of the wafer in a plane parallel to the first surface of the wafer and at a juncture between the first via portion and the second via portion.

31. The method of claim 28, further comprising heating a conductive material filling the second via portion and the third via portion to a reflow temperature and permitting the heated conductive material to solidify into a ball.

32. The method of claim 1, wherein performing the augmented etch phase further comprises performing a polymer deposition phase from the first surface.

33. A method of forming at least one via in a wafer, comprising:
    providing a wafer having a first surface and an opposing, second surface;
    etching a first via portion having a first diameter within the wafer by performing at least one cycle of alternately performing a first etch phase and a polymer deposition phase from the first surface;
    etching a second via portion having a second diameter greater than the first diameter of the first via portion by performing an augmented etch phase, the first via portion and the second via portion together forming a blind via in the wafer; and
    removing a portion of the opposing, second surface of the wafer to at least partially expose the second via portion cavity forming a vented via in the wafer.

34. The method of claim 33, wherein performing the augmented etch phase further comprises performing a polymer deposition phase from the first surface.

35. The method of claim 33, further comprising filling the vented via with solder by one of a wave soldering process, physically placing a solder paste within the vented via, and reflowing preformed solder balls placed over the vented via.

\* \* \* \* \*

UNITED STATES PATENT AND TRADEMARK OFFICE
CERTIFICATE OF CORRECTION

PATENT NO. : 7,425,507 B2 Page 1 of 1
APPLICATION NO. : 11/168787
DATED : September 16, 2008
INVENTOR(S) : Rickie C. Lake It is certified that error appears in the above-identified patent and that said Letters Patent is hereby corrected as shown below:

In column 13, line 12, in Claim 27, delete "third" and insert -- third via --, therefor.

Signed and Sealed this

Eighteenth Day of November, 2008

JON W. DUDAS
*Director of the United States Patent and Trademark Office*